(12) United States Patent
Dai et al.

(10) Patent No.: US 10,319,100 B2
(45) Date of Patent: Jun. 11, 2019

(54) METHODS, DEVICES, AND SYSTEMS FOR IDENTIFYING AND TRACKING AN OBJECT WITH MULTIPLE CAMERAS

(71) Applicant: Guangdong Virtual Reality Technology Co., Ltd., Shenzhen, Guangdong Province (CN)

(72) Inventors: Jingwen Dai, Shenzhen (CN); Yongtao Hu, Shenzhen (CN); Jie He, Shenzhen (CN)

(73) Assignee: GUANGDONG VIRTUAL REALITY TECHNOLOGY CO., LTD., Shenzhen, Guangdong Province (CN)

( * ) Notice: Subject to any disclaimer, the term of this patent is extended or adjusted under 35 U.S.C. 154(b) by 13 days.

(21) Appl. No.: 15/669,822

(22) Filed: Aug. 4, 2017

(65) Prior Publication Data
US 2019/0012795 A1    Jan. 10, 2019

(30) Foreign Application Priority Data

Jul. 7, 2017    (WO) ................ PCT/CN2017/092155

(51) Int. Cl.
*G06K 9/00* (2006.01)
*G06T 7/292* (2017.01)
(Continued)

(52) U.S. Cl.
CPC .............. *G06T 7/292* (2017.01); *G06T 7/248* (2017.01); *G06T 7/74* (2017.01); *G06T 7/80* (2017.01);
(Continued)

(58) Field of Classification Search
CPC .. G06T 7/292; G06T 7/80; G06T 7/74; G06T 7/248; G06T 7/70; G06T 7/246;
(Continued)

(56) References Cited

U.S. PATENT DOCUMENTS

| 2008/0284980 A1* | 11/2008 | Skogo | A61B 3/113 |
| | | | 351/210 |
| 2013/0207887 A1* | 8/2013 | Raffle | G02B 27/00 |
| | | | 345/156 |

(Continued)

FOREIGN PATENT DOCUMENTS

WO    WO-2005065527 A1 *    7/2005    ............. A61B 3/113

OTHER PUBLICATIONS

Torr, P.H.S. et al., "The Development and Comparison of Robust Methods for Estimating the Fundamental Matrix," 1997, International Journal of Computer Vision, vol. 24, No. 3, pp. 271-300.*

*Primary Examiner* — Jose L Couso
(74) *Attorney, Agent, or Firm* — Cheng-Ju Chiang

(57) ABSTRACT

An object identifying and tracking device is provided. The device includes a first image capturer to capture a first raw image of an object, a second image capturer to capture a second raw image of the object, a first processor, a second processor and a post processor. The object includes a first light source emitting light of a first wavelength and a second light source emitting light of a second wavelength. The first processor and the second processor respectively receive the first and the second raw images and respectively extract a first group of information associated with the light of the first wavelength and a second group of information associated with the light of the second wavelength emitted from the object. The post processor processes the first group of information and the second group of information to obtain a third group of information.

19 Claims, 7 Drawing Sheets

(51) Int. Cl.
*G06T 7/246* (2017.01)
*G06T 7/73* (2017.01)
*G06T 7/80* (2017.01)
*H01L 27/146* (2006.01)

(52) U.S. Cl.
CPC .... *H01L 27/14621* (2013.01); *G06T 2200/28* (2013.01); *G06T 2207/10024* (2013.01); *G06T 2207/10028* (2013.01); *G06T 2207/10048* (2013.01)

(58) Field of Classification Search
CPC ......... G06T 19/006; G06T 2207/10152; H01L 27/14621; G06K 9/00604; G02B 2027/0138; G02B 2027/014; G02B 2027/0172; G02B 27/0093; G06F 3/012; G06F 3/013; G06F 3/011; G06F 3/0304; G06F 3/042; A61B 3/113
See application file for complete search history.

(56) References Cited

U.S. PATENT DOCUMENTS

| | | | |
|---|---|---|---|
| 2015/0177831 A1* | 6/2015 | Chan | G06F 3/013 345/156 |
| 2016/0202484 A1* | 7/2016 | Ouderkirk | G02B 27/017 348/78 |
| 2016/0349514 A1* | 12/2016 | Alexander | G06F 3/013 |
| 2017/0192499 A1* | 7/2017 | Trail | G06F 3/013 |
| 2017/0205876 A1* | 7/2017 | Vidal | G01S 17/88 |
| 2017/0292828 A1* | 10/2017 | Hillebrand | G06T 7/62 |
| 2017/0303790 A1* | 10/2017 | Bala | H04N 5/23293 |
| 2017/0339400 A1* | 11/2017 | Hall | G06T 7/0018 |
| 2018/0046859 A1* | 2/2018 | Jarvenpaa | G02B 27/0172 |
| 2018/0149874 A1* | 5/2018 | Aleem | H04N 9/3102 |
| 2018/0232047 A1* | 8/2018 | Yoon | G06F 3/012 |

\* cited by examiner

METHODS, DEVICES, AND SYSTEMS FOR IDENTIFYING AND TRACKING AN OBJECT WITH MULTIPLE CAMERAS

FIELD OF THE INVENTION

The present disclosure relates to the field of identifying and tracking object. More particularly, and without limitation, the disclosed embodiments relate to methods, devices, and systems for identifying and tracking a light-emitting object using multiple cameras, which can respond to signal sources, such as different ranges of wavelengths of light sources.

BACKGROUND OF THE INVENTION

Virtual reality (VR) systems and/or applications generally create a virtual environment for a user through a wearable headset and artificially immerse the user or simulate the user's presence in the virtual environment. To further allow user interaction with the virtual environment, technologies are being developed to allow the user to interact with the objects in the virtual environment. Positional information of the user is desirably detected and inputted into the VR systems and/or applications. For example, positional tracking methods may be used to track the position and/or movement of the user through tracking a trackable device (with a signal source such as a light source, etc.) attached to a part of user's body. For example, the trackable device can be a controller held in user's hand with a signal source which can be detected by a signal detector. In such instance, one or more controllers may be detected, identified, and/or tracked.

The trackable device includes a signal source. A tracking device can detect and capture the signal emitted by the signal source, and can accordingly track the movement of the trackable device based on the locations of the signal source. The signal source has a great range of varieties, such as a visible light source, an infrared light source, an ultraviolet light source, a millimeter wave source, etc. Each source has its own features with both strength and weakness. For instance, the trackable device may be exposed to an environment fulfilled with ambient lights. If a visible light source is chosen as a single source, it could be obfuscated by ambient lights such as sunlight, fluorescent lamp lights, or LED lights, which may affect the accurate detection and/or tracking of the device. Moreover, if there are ambient lights in the environment and the ambient lights are of the same color as the light emitted by the trackable device, it may become difficult for a camera to differentiate the trackable device from the background environment. As a result, the detection and the location of trackable device can become inaccurate. If an infrared light source is chosen, when there are multiple devices applied in the same scene, it would be hard to identify each device. Some solutions use multiple infrared-LEDs groups which twinkle in a pre-determined pattern, so each group has its particular pattern being able to be identified. Nevertheless, forming a twinkle pattern needs extra time and increases the total processing time, which would produces time delays and harm the user experience.

SUMMARY OF THE INVENTION

The embodiments of the present disclosure include tracking devices, systems, and methods that allow for both position tracking and identification of one or multiple objects. Advantageously, an exemplary system of the present disclosure receives a first image and a second image representing two different views of a trackable object via two image capturers, detects a first pixel location of the object in the first image, calculates a candidate pixel region in the second image based on the first pixel location of the object in the first image, searches for the same object in the candidate pixel region in the second image, and then determines the second pixel location of the object in the second image. In some embodiments, the two images can be associated with light signals of different wavelengths, and the two image capturers have different wavelength responses according to the different wavelengths of the light signals. With these arrangements, as there will be less possibility of existence of an ambient light combined with two different wavelengths, the detection of the object from the first and second images and the determination of the pixel locations can be less susceptible to the interference of ambient light signals in the background environment. As a result, the identification and tracking of the objects from the images can be more accurate and robust.

The present disclosure also includes an object identifying and tracking device, comprising: a first image capturer to capture a first raw image of a trackable object, wherein the trackable object comprises a first light source emitting light of a first wavelength and a second light source emitting light of a second wavelength; a second image capturer to capture a second raw image of the trackable object; a first processor, coupled to the first image capturer, to receive the first raw image and extract a first group of information from the first raw image, wherein the first raw image is associated with the light of the first wavelength emitted from the trackable object; a second processor, coupled to the second image capturer, to receive the second raw image and extract a second group of information from the second raw image, wherein the second raw image is associated with the light of the second wavelength emitted from the trackable object; and a post processor, coupled to the first processor and the second processor, to process the first group of information and the second group of information to obtain a third group of information.

The present disclosure further includes an object identifying and tracking method, comprising: combining at least two light elements of different wavelength together to form a light source inside a trackable object, wherein the first light source emits light of a first wavelength, the second light source emits light of a second wavelength; disposing the light source onto a place in real world whose location is interested by the VR system; constructing an image capture system using at least two image sensors and two band-pass filters, wherein the first band-pass filter allows light of a first wavelength to pass through, and the second band-pass filter allows light of a second wavelength to pass through; capturing a pair of raw image, through the image capture system, by obtaining a first raw image through the first band-pass filter and a second raw image through the second band-pass filter; processing the first raw image to obtain a first group of information; processing the second raw image to obtain a second group of information; and processing the first group of information and the second group of information to obtain a third group of information of the trackable object.

The details of one or more variations of the subject matter disclosed herein are set forth below and the accompanying drawings. Other features and advantages of the subject matter disclosed herein will be apparent from the detailed description below and drawings, and from the claims.

Further modifications and alternative embodiments will be apparent to those of ordinary skill in the art in view of the disclosure herein. For example, the systems and the methods may include additional components or steps that are omitted from the diagrams and description for clarity of operation. Accordingly, the detailed description below is to be construed as illustrative only and is for the purpose of teaching those skilled in the art the general manner of carrying out the present disclosure. It is to be understood that the various embodiments disclosed herein are to be taken as exemplary. Elements and structures, and arrangements of those elements and structures, may be substituted for those illustrated and disclosed herein, objects and processes may be reversed, and certain features of the present teachings may be utilized independently, all as would be apparent to one skilled in the art after having the benefit of the disclosure herein.

BRIEF DESCRIPTION OF THE DRAWINGS

The accompanying drawings, which are incorporated in and constitute a part of this specification, illustrate exemplary embodiments of the present disclosure, and together with the description, serve to explain the principles of the disclosure.

DETAILED DESCRIPTION OF PREFERRED EMBODIMENTS

This description and the accompanying drawings that illustrate exemplary embodiments should not be taken as limiting. Various mechanical, structural, electrical, and operational changes may be made without departing from the scope of this description and the claims, including equivalents. In some instances, well-known structures and techniques have not been shown or described in detail so as not to obscure the disclosure. Similar reference numbers in two or more figures represent the same or similar elements. Furthermore, elements and their associated features that are disclosed in detail with reference to one embodiment may, whenever practical, be included in other embodiments in which they are not specifically shown or described. For example, if an element is described in detail with reference to one embodiment and is not described with reference to a second embodiment, the element may nevertheless be claimed as included in the second embodiment.

The disclosed embodiments relate to systems and methods for identifying and/or automatic tracking of an object (e.g., a marker or a controller) in application of a Virtual Reality (VR) system. Embodiments of the present disclosure may be implemented in a VR system, offering means for a user to interact with objects and/or people in a virtual reality environment. For example, the user holds an interaction device, which may be displayed as a console in the virtual reality environment, and the user may operate the console to move and/or grab an object in the VR world, and/or point it to one person in the VR world and talk to him/her. For these applications, the VR system needs to project the interaction device from the real world into the VR world based on its position in the real environment. Therefore, the VR system is required to identify and track the interaction device precisely, with anti-interference ability and low latency.

Reference will now be made in details to embodiments and aspects of the present disclosure, examples of which are illustrated in the accompanying drawings. Where possible, the same reference numbers will be used throughout the drawings to refer to the same or like parts. Those of ordinary skills in the art in view of the disclosure herein will recognize that features of one or more of the embodiments described in the present disclosure may be selectively combined or alternatively used.

Figure 1:
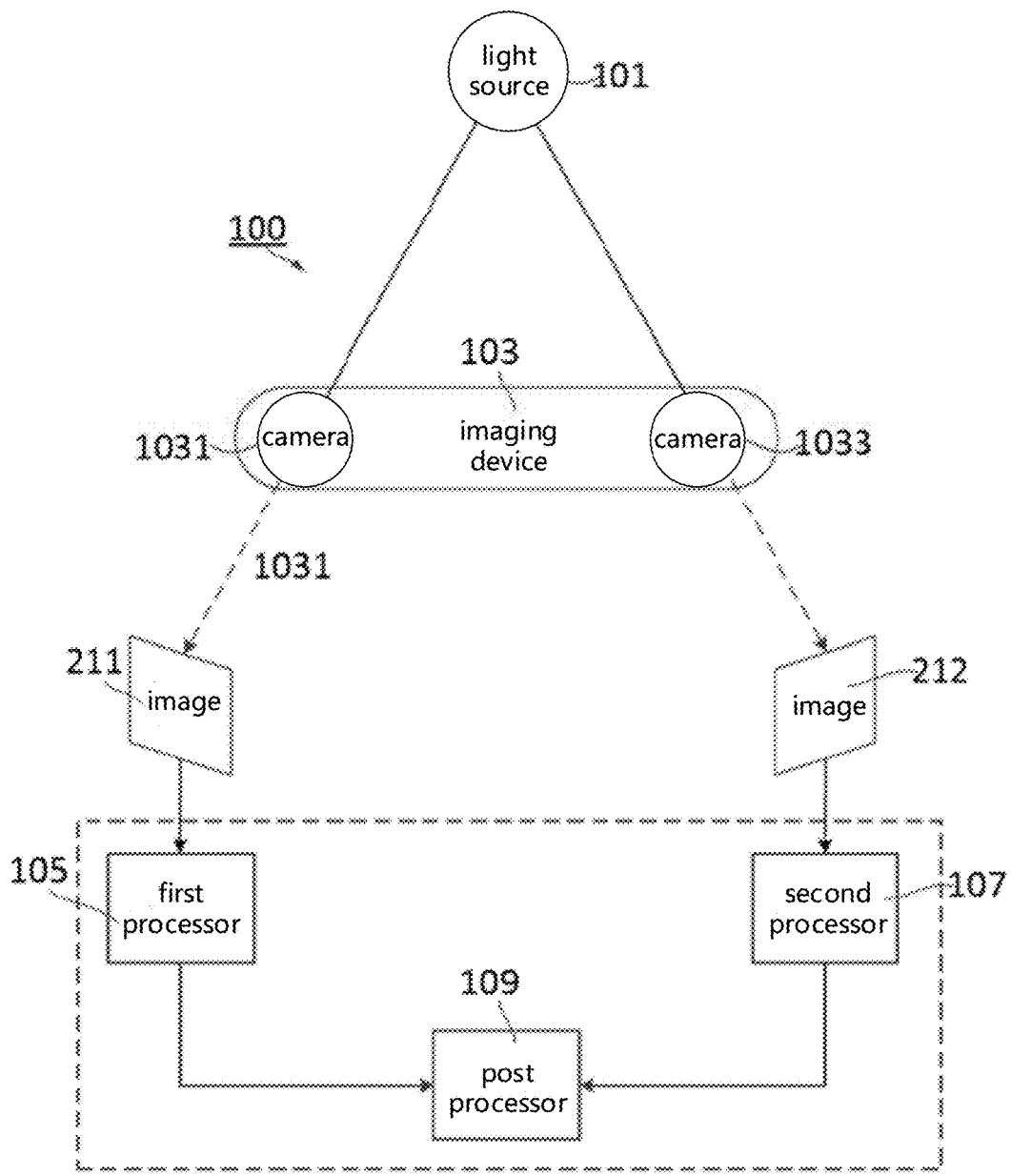
FIG. 1 illustrates schematic representations of an exemplary system for identifying and tracking an object, according to embodiments of the present disclosure.

FIG. 1 illustrates the schematic representations of an exemplary VR system 100 for identifying and tracking an object, according to embodiments of the present disclosure. As shown in FIG. 1, system 100 may include one or more light source 101, an imaging device 103, a first processor 105, a second processor 107, and a post processor 109. Imaging device 103 may include a camera 1031 and a camera 1033, forming a stereo camera that may capture a set of frames continuously. For example, in one frame among the set of the frames, a pair of images includes images 211 and 212 captured by cameras 1031 and 1033 respectively, and images 211 and 212 may be captured simultaneously.

Figure 2:
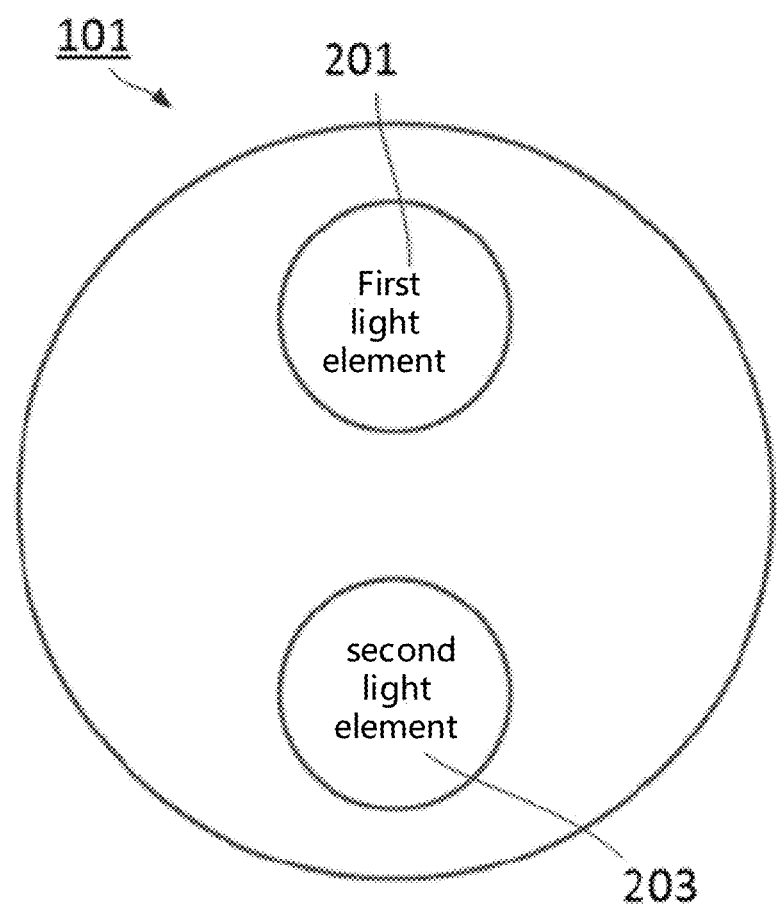
FIG. 2 illustrates an exemplary structure of a light source, according to some embodiments of the disclosure.

To achieve the foregoing requirements for the VR system, it may be necessary to provide a unique signal source for generating a light signal that is seldom be found in our daily life. FIG. 2 illustrates an exemplary structure of light source 101, according to some embodiments of the disclosure.

Light source 101 may include at least two light elements. The at least two light elements may generate light with different wavelength. For example, during the operation of system 100, both/all the light elements are turned on and generate light. The light elements may include LEDs or incandescent light bulbs. As shown in FIG. 2, light source 101 includes two light elements 201 and 203. First light element 201 may generate light of a first wavelength, and second light element 203 may generate light of a second wavelength. The light of the first wavelength may be invisible light, and the light of the second wavelength may be visible light. In some embodiments, first light element 201 is an infrared light source, therefore the first wavelength is in a range from 760 nm to 1 mm, and second light element 203 is a visible light source, therefore the second wavelength is in a range from 390 nm to 760 nm. In one embodiment, the light elements (for example, light elements 201 and 203) are covered by a diffusive cover of a predetermined shape. The diffusive cover may be configured to scatter the light generated by the light elements, for example, evenly in all directions. With such configuration, light source 101 including the light elements 201 and 203 may appear to have a uniform light intensity and a particular shape.

In some embodiments, light source 101 may be identified and tracked in a VR system. A representation of a user may be generated in the VR environment based on the identity and location of light source 101 in real world. In some embodiments, light source 101 may be attached to any place in real world.

Figure 3:
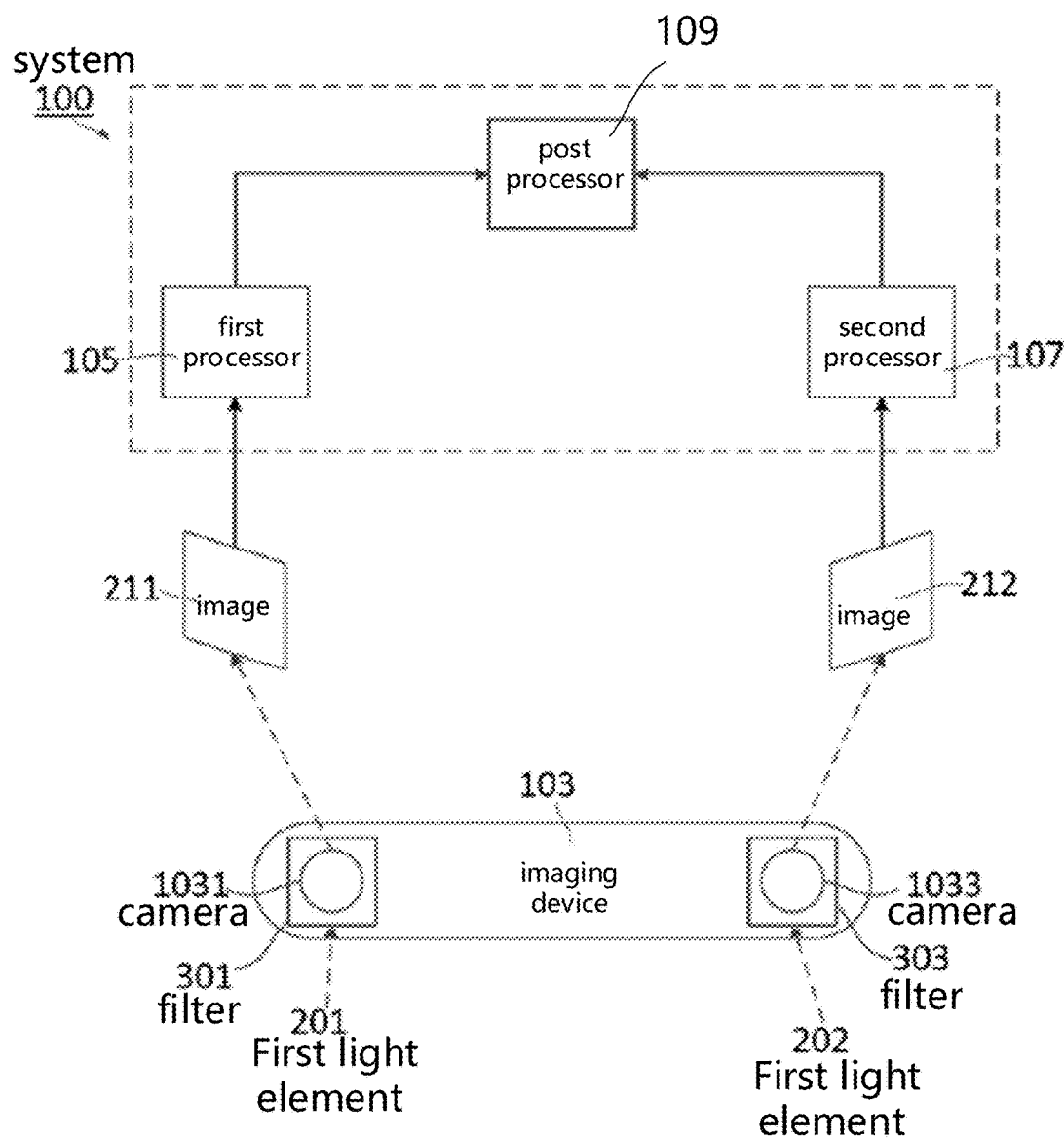
FIG. 3 illustrates an exemplary structure of an imaging device, according to some embodiments of the disclosure.

In some embodiments, light source 101 generates invisible light (e.g., infrared light) and visible light (e.g., color visible light) simultaneously, wherein the visible light is used to distinguish the identity of light source 101, and both the invisible light and the visible light are used to determine the position of light source 101. For this purpose, it is necessary to provide imaging device 103 to capture both invisible light and visible light. FIG. 3 illustrates an exemplary structure of an imaging device 103, according to some embodiments of the disclosure.

As shown in FIG. 3, imaging device 103 is configured to capture light generated by light source 101 (not shown in FIG. 3) according to some embodiments of the disclosure. Two cameras 1031 and 1033 may be respectively set, for example, at two ends of imaging device 103. Cameras 1031 and 1033 may each include sensor arrays configured to convert captured light signals into electrical signals. The sensor arrays may, for example, include a charge-coupled device (CCD) sensor, a complementary metal oxide semiconductor (CMOS) sensor, or the like. The sensor array included in camera 1031 and camera 1033 may include light sensitive image sensors.

Cameras 1031 may be configured to capture invisible light (e.g., infrared light). For example, only light of a wavelength range from 760 nm to 1 mm may be captured by camera 1031. And, camera 1033 may be configured to capture visible light (e.g., RGB visible light).

In some other embodiments, cameras 1031 and 1033 may be provided with filters to only capture particular light. As shown in FIG. 3, imaging device 103 may include cameras 1031 and 1033, and each of the cameras has a band-pass filter installed in front of lens of the cameras, respectively. For example, a filter 301 is installed in front of the lens of the camera 1031, allowing light of a wavelength range from 760 nm to 1 mm (e.g., infrared light) to pass through. And a filter 303 is installed in front of the lens of the camera 1033, allowing light of a wavelength range from 390 nm to 760 nm (e.g., visible light) to pass through. In such cases, camera 1031 only receives infrared light generated from light source 101 and camera 1033 only receives visible light generated from light source 101, even when light source 101 includes both light elements for generating infrared light and visible light.

In some embodiments, the light sensitive image sensors of cameras 1031 and 1033 may be sensitive to all kinds of light or some particular light (e.g., invisible light or visible light). For example, camera 1031 may include invisible-light sensitive image sensors, and camera 1033 may include visible-light sensitive image sensors, so that cameras 1031 and 1033 may capture particular light respectively even without filters.

It is appreciated that, particular filters or sensors are merely exemplary components for the cameras to only capture particular light, and other components may be adopted.

When cameras 1031 and 1033 are exposed in an environment having light source 101, images 211 and 212 may be generated respectively. Each of images 211 and 212 may include a set of pixels corresponding to the light source. Respectively, image 211 is sent to the first processor 105 and image 212 is sent to the second processor 107 for further process.

In some embodiments, in the first processor 105, image 211 is processed and a first group of information is extracted from image 211. For example, image 211 may be filtered and binarized to extract the first group of information. In some embodiments, the first group of information contains a binarized image of image 211. As discussed above, only light of a wavelength range from 760 nm to 1 mm can be captured by camera 1031. Thus, in image 211, only infrared light is imaged.

Generally, infrared light intensity of first light element 201 is much larger than the intensity of ambient infrared light. Therefore, it is possible to determine a threshold value according to the infrared light intensity of first light element 201, and filter the ambient infrared light based on the threshold value. The threshold value may be compared with pixel values of pixels in image 211. If a pixel value of a pixel is greater than the threshold value, the pixel value may be updated to "1" for the pixel; otherwise, the pixel value may be updated to "0". Thus, interference generated from the ambient infrared light may be filtered, and image 211 may be binarized. Other methods also could be applied to pre-process image 211 for filtering and binarizing.

From the pre-processed image (e.g., binarized image) of image 211, more information may be extracted for identifying and tracking light source 101.

In some embodiments, multiple light sources 101 may be provided, and therefore a plurality of sets of pixels corresponding to the light sources 101 may be included in image 211 and corresponding pre-processed image. First processor 105 may traverse all pixels in the pre-processed image, and determine some connected domains associated with the plurality of sets of pixels, which corresponds to light elements 203 of the light sources 101. According to the determined connected domains, positions of light elements 203 may be determined in image 211. A connected domain in the pre-processed image corresponds to a candidate pixel region in the raw image (e.g., image 211).

After determining the connected domains of the light sources, the center of each connected domain may be calculated by the first processor 105. In one embodiment, based on the pre-processed image (e.g., binarized image), a shape center of a connected domain may be determined. In another embodiment, based on both coordinates of pixels of a connected domain in the pre-processed image and pixel values of a region corresponding to the connected domain in raw image 211, a weighted mean center of the connected domain may be determined. Other methods may be adopted to calculate centers of the connected domains.

In some embodiments, the first group of information may further contain, in image 212, a candidate area corresponding to light source 101. As discussed above with reference to FIG. 3, RGB visible light may pass through filter 303 and be captured by camera 1033 to generate image 212. Because light element 203 of light source 101 generates visible light signals and the ambient environment may also provide omnifarious visible light, it is hard to determine light source 101 in image 212. Thus, information extracted from infrared image 211 may be utilized to help the system to determine which part of image 212 corresponds to light source 101.

Figure 4A:
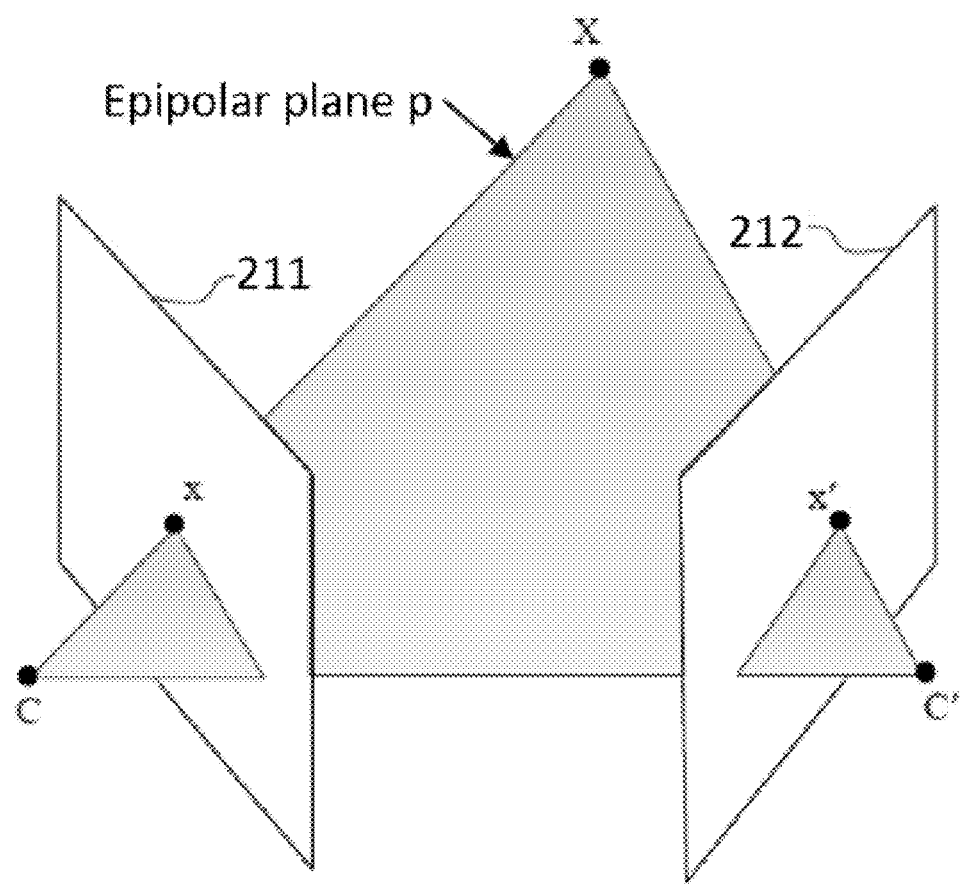
FIGS. 4A and 4B illustrate the principle of Epipolar Geometry.
Figure 4B:
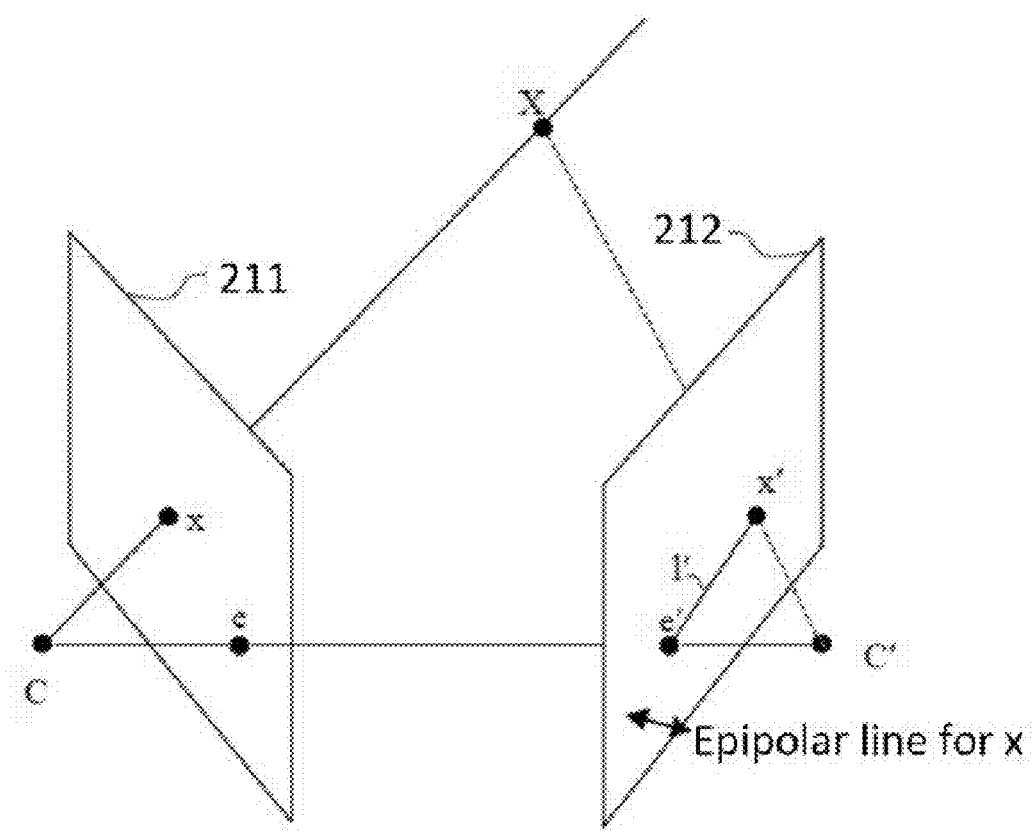

The location of light source 101 in images 211 and 212 can be related according to Epipolar Geometry, which defines an intrinsic projective geometry between two views of an object (e.g., light source 101). Reference now is made to FIGS. 4A and 4B, which illustrate the principle of Epipolar Geometry. In FIG. 4A, point X indicates light source 101 in real world, point C indicates the center of camera 1031, point C' indicates the center of camera 1033. Point X is imaged at point x in image 211 and imaged at point x' in image 212, respectively. As shown in FIG. 4A, points x and x', point X, and camera centers C and C' are coplanar, and a plane defined by those points is called an epipolar plane. As shown in FIG. 4B, the intersection l' of epipolar plane with image plane of image 212 is an epipolar line of point x, and the image of X in image 212 must lie on line V. Point x' in image 212 corresponding to point x in image 211, as shown in FIG. 4A, must lie on the epipolar line V. Thus, point x in image 211 may be mapped to the epipolar line V. That is, a point in one image may be mapped to its corresponding epipolar line in the other image. This mapping may be a singular correlation, and may be represented by a fundamental matrix [F].

For each point along the line CX, the positions of its imaged points on image 212 along the image line l' can be determined based on the exemplary expression below:

$$l'=[F][x] \qquad \text{(Expression 1)}$$

Herein, [F] is a 3×3 matrix, [x] is a vector that represents physical positions of the points in the line CX, and l' represents the positions of its imaged points on image 212. Fundamental matrix [F] can represent a projective geometry that translates the position of a point along the line CX to its corresponding image position along the image line V.

The matrix values of [F] may depend on, for example, internal parameters (e.g., focal distance, refractive index, diopter, etc.) of cameras 1031 and 1033, and their relative positions. In some embodiments, the matrix values of [F] can be determined in a calibration process before the cameras are used to capture images of light source 101. For example, cameras 1031 and 1033 can be applied to capture a first and a second images of a marker (e.g., light source 101), and the fundamental matrix may be determined based on the pixel locations of the marker in the first and second images.

In some embodiments, the matrix values of [F] can also be determined in an on-the-fly calibration process (OTFC) after the cameras start capturing pairs of first and second images of light source 101 successively. Candidate pixel region that corresponds to light source 101 may be then identified from a pair of first and second images, based on the shape, size, color, etc. of light source 101. The system can then determine candidate values of the fundamental matrix based on the candidate pixel region in the pair of first and second images, and then verify (or adjust) the fundamental matrix based on other identified candidate pixel region in other pairs of the first and second images.

As the candidate pixel region associated with the image of light source 101 in image 211 has been find out, it is possible to calculate a group of epipolar lines in image 212 corresponding to light source 101, according to said pixels region, values of the [F], and Expression 1. That is, the image of light source 101 must lie in a candidate area formed by the group of epipolar lines. Thus, it only has to search for the image of light source 101 in said candidate area.

In one embodiment, after obtaining the candidate area of image 212, the second processor 107 may use information of the candidate area to operate on the image 212. In some embodiments, a second group of information is extracted from image 212 by the second processor 107. In one embodiment, the second group of information contains a demosaic image of image 212, the method for demosaicing is based on the pattern of a second band-pass filter array. In some embodiments, the filter array of camera 1033 may be a color filter array of a particular pattern, which could be red-green-blue (RGB), hue-saturation-lightness (HSL), YCbCr, YUV, LAB, etc. According to the pattern of the filter array, image 212 may be demosaiced from a greyscale image to a color image (not shown in FIGS. 4A and 4B). The demosaicing method may be an interpolation algorithm corresponding to the pattern of the filter array. In one embodiment, the color filter array may be in an RGB style. In this case, after the demosaicing, every pixel of color image has an R value, a G value, and a B value.

In one embodiment, the second group information may further contain a candidate pixels region associated with light source 101 in color image. As the color of light element 203 of light source 101 is predetermined, a group of predetermined ranges of the R, G, B values corresponding to the color of the light element 203 may be applied as a reference range. The second processor 107 may traverse pixels in the candidate area of color image and compare each pixel's R, G, B values to the reference range of values. For example, if R, G, B values of a pixel fall within the reference range, it means that the pixel corresponds to light source 101. Thus, the second processor 107 may determine this pixel to be a part of candidate pixels region of the image of light source 101 in image 212. In other embodiments, other methods may also be applied to determine which pixel corresponds to light source 101.

In one embodiment, the second group of information may further contain the coordinates of the center of the candidate pixels region associated with light source 101 in color image. After determining the candidate pixels region of the light sources 101, the center of each region may be calculated by the second processor 107. For example, a shape center may be determined according to the pre-processed image, a weighted mean center may be determined according to both coordinates of pixels in candidate regions of light source 101 in color image and the pixel values of corresponding regions in raw image 212, and any other calculated center may be recognized as the center of the region, in other words, the center of light source 101 imaged in image 212.

Thus, centers of the light sources 101 in both images 211 and 212 are found, as a part of the first and the second group of information. The second group information may be further sent to the post processor 109. In one embodiment, the post processor 109 further extracts a third group of information from the first group of information and the second group of information. In some embodiments, the third group information may contain the 3D positions of light sources 101 in real world. As the imaging device 103 is a stereo camera device, it is possible to do the depth estimation based on the image 211 and image 212, which form a pair of views for a stereo camera device. With the depth estimation, the post processor 109 may obtain the 3D coordinates of the light source 101. In one embodiment, the third group of information may further contain identities for each of the light sources 101. As the identity of the light source 101 may be determined according to the color of the light source 101, the post processor 109 may utilize the color ranges of the candidate pixels region and the coordinates of the centers of the light source 101 to make the position and the identity of the light source 101 one-to-one correspondence.

Figure 5:
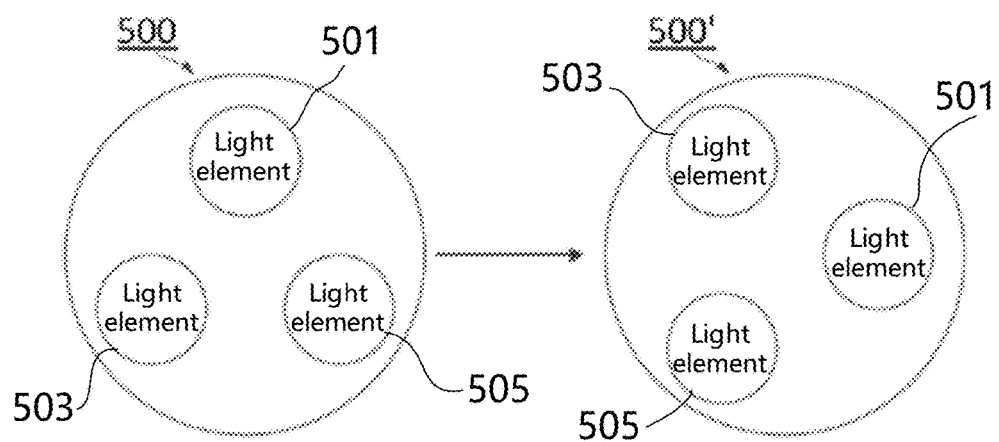
FIG. 5 illustrates an exemplary structure of another light source, according to some embodiments of the disclosure.

In other embodiments, the third group of information may further contain other useful contents. For instance, if three or more light sources with different colors are tied on one object in real world, it is possible to further determine an orientation of the object. FIG. 5 illustrates an exemplary structure of a light source 500, according to some embodiments of the disclosure.

As shown in FIG. 5, a light source 500 includes three light elements 501, 503, and 505. Light element 501 emits red light, light element 503 emits green light, and light element 505 emits blue light, for example. As discussed above, positions of the three light elements 501, 503, and 505 may be determined. Therefore, it is possible to further determine a relative positional relation among the three light elements 501, 503, and 505. For example, light element 501 may be determined to be above light elements 503 and 505. And when light source 500 is rotated clockwise by 90 degrees, light element 501 may be determined to be on a right side of light elements 503 and 505. Therefore, the orientation of the object (e.g., light source 500) may be determined.

In other embodiments, the identifying and tracking system may be used for other purposes, without special limitations, so the third group of information may further contain other contents corresponding to these purposes.

Figure 6:
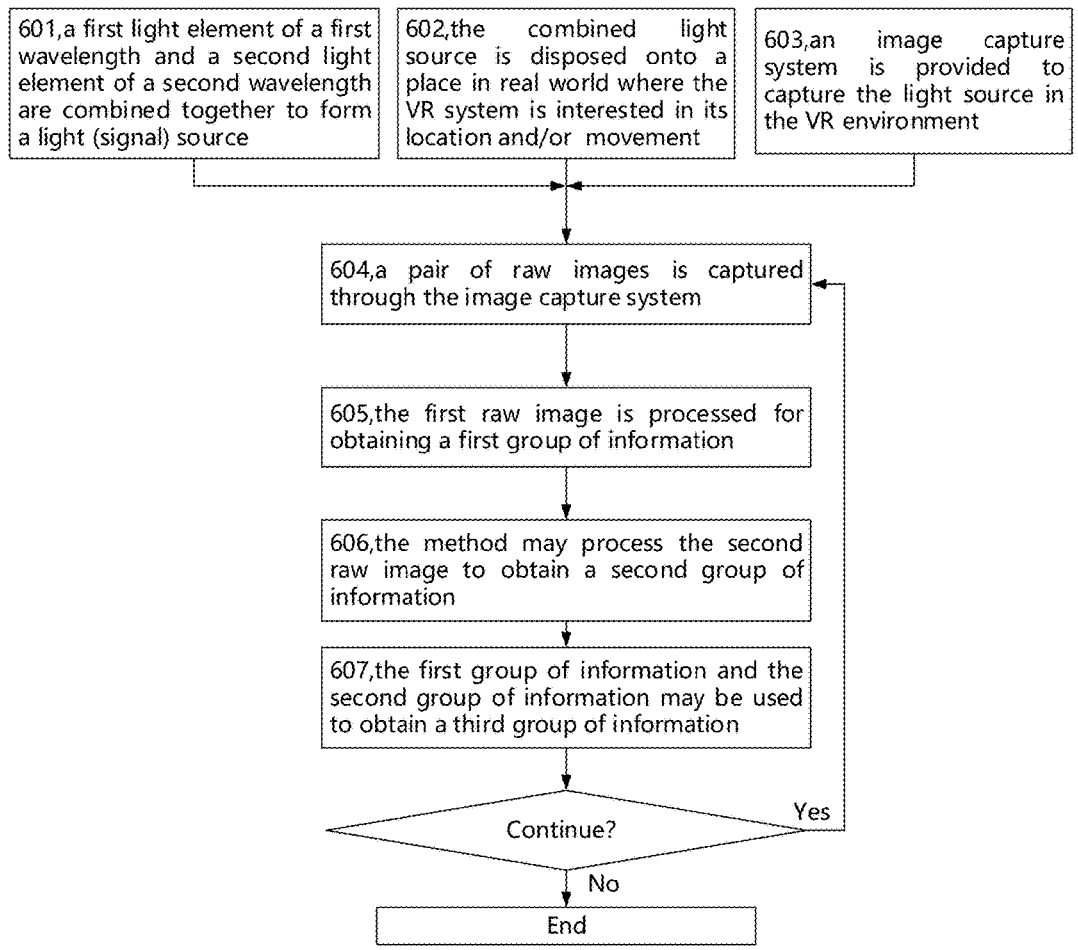
FIG. 6 illustrates a flow chat of a method for determining an identity and location of an object in a VR system, according to some embodiments of the disclosure.

The present disclosure may also include a method for identifying and tracking an object, in accordance with one embodiment of the present invention. FIG. 6 illustrates a flow chat of a method for determining an identity and location of an interested object in a VR system, according to some embodiments of the disclosure. The method may be executed by above-described system 100, and include steps 601-607.

In step 601, a first light element of a first wavelength and a second light element of a second wavelength are combined together to form a light (signal) source, wherein the first light element emits light of said first wavelength, and the second light element emits light of said second wavelength. In some embodiments, as discussed above, the first wavelength is different from the second wavelength. In one embodiment, the range of first wavelength does not overlap the range of second wavelength. For example, the first light element is an infrared light source, therefore the first wavelength is in a range from 760 nm to 1 mm, and the second light element is a visible light source, therefore the second wavelength is in a range from 390 nm to 760 nm.

In step 602, the combined light source is disposed onto a place in real world where the VR system is interested in its location and/or movement. The place in real world may include user's hands, a part of the body of user, or other similar place. In one embodiment, the light source may be attached to a game controller, and the user grabs the controller to move and plays in the VR environment, the location and/or the movement of the controller is used as an input for the VR system.

In step 603, an image capture system is provided to capture the light source in the VR environment, wherein, the light source is disposed in the field of view of the image capture system. In some embodiments, the image capture system includes a first camera and a second camera, which may response to different light wavelengths respectively. In one embodiment, each of the first and second cameras comprises a band-pass filter. A first filter for the first camera may be configured to capture invisible light (e.g., infrared light), which allows light of wavelength in a range from 760 nm to 1 mm to pass through, and a second filter for the second camera may be configured to capture visible light (e.g., RGB visible light), which allows light of wavelength in a range from 390 nm to 760 nm to pass through.

Steps 601, 602, and 603 are preparatory work for the whole method.

After these preparations are done, in step 604, a pair of raw images is captured through the image capture system. The raw images include a first raw image 211 and a second raw image 212. In one embodiment, as the ranges of the wavelength of the two light elements of the light source are the same as the response ranges of wavelength of the two band-pass filters, it causes the first light element 201 (generates IR signal) to be only imaged in image 211 rather than in image 212. Similarly, the second light element 203 (generates RGB signal) is only imaged in image 212 rather than in image 211. Locations of pixels in image 211 associated with the light source corresponds to locations of pixels in image 212 associated with the same light source according to the epipolar geometry, as discussed above.

In step 605, the first raw image is processed for obtaining a first group of information. In some embodiments, the first group of information may comprise a pre-processed first image based on said first raw image, a first candidate pixel region associated with at least one trackable object (e.g., the light source) in the first raw image, first coordinates of the center of said at least one trackable object in the first raw image, and a candidate pixel area of said at least one trackable object in the seconds raw image. In one embodiment, the first raw image may be refined by a filter. For example, pixels in the whole first raw image may be traversed, so that each of pixel values for the pixels may be compared to a predetermined threshold value. If the pixel value is greater than the threshold value, the pixel value may be updated to "1"; otherwise, the pixel value may be updated to "0". In some embodiments, other filter algorithms are applied to filter noise signals in the first raw image. In one embodiment, the pre-processed image may be used to determine a connected domain in the image. The connected domain is a representation of the light source imaged in the first raw image. In one embodiment, the connected domain, the raw image, and the pre-processed image may be used to determine the location of the center of the light source in the image. In one embodiment, a shape center may be calculated as the center of the light source. In another embodiment, a weighted mean center may be calculated as the center of the light source. Values of pixels in the connected domain may be used to calculate the weighted mean center. In some embodiments, other methods may be also applied to obtain the location of center of the light source in the first raw image. In one embodiment, the method may calculate the candidate pixel area of said at least one trackable object in the second raw image, using the epipolar geometry as introduced above.

In step 606, the method may process the second raw image to obtain a second group of information. In one embodiment, the method processes the second raw image based on the first group of information obtained in step 605. In some embodiments, the second group of information comprises a pre-processed second image based on said second raw image, a second candidate pixel region associated with said at least one trackable object in the second raw image, second coordinates of the center of the pixels in said second candidate pixel region associated with said at least one trackable object in the second raw image, and an identity of the trackable object. In some embodiments, the second raw image may be pre-processed based on the pattern of the second filter. In one embodiment, the pattern of the second filter is in a Bayer RGB pattern, and the second raw image may be reconstructed by an interpolation algorithm. After the interpolation, a color image may be obtained, and every pixel in this color image has three pixel values (R, G, B). In other embodiments, the filter may also include a kind of color filter array of other particular pattern, which could be hue-saturation-lightness (HSL), YCbCr, YUV, LAB, without specific limitations. In some embodiments, the method searches in the candidate pixel area for said at least one trackable object in the second color image, which is obtained in step 605. As the color represents the identity of the light source and the R, G, and B value of the color is already known, the whole color image may be traversed to compare each pixel's RGB value to the known RGB value to determine whether the pixel is associated with the light source. The pixels that associate with the light source may be recorded. In some embodiments, the connected domain of these pixels may be further recorded. In some embodiments, the center of the connected domain may be determined as the center of the light source imaged in the second image. For example, a shape center may be determined as the center of the domain in accordance with the pre-processed image, and a weighted mean center may be determined as the center of the domain, in accordance with both coordinates of pixels of candidate pixel regions associated with light source in the pre-processed image and the pixel values in color image. Other kinds of calculated center may be recognized as the center of the domain.

In step 607, the first group of information and the second group of information may be used to obtain a third group of information. In some embodiments, the third group of information comprises 3D coordinates of the center of at least one trackable object in space, an identity of at least one trackable object, the orientation of at least trackable object in space, the trajectory of at least trackable object in space, the velocity and/or acceleration of at least one trackable object in space.

The foregoing description is presented for purposes of illustration. It is not exhaustive and is not limited to precise forms or embodiments disclosed. Modifications and adaptations of the embodiments will be apparent from consideration of the specification and practice of the disclosed embodiments. For example, the described implementations include hardware and software, but systems and methods consistent with the present disclosure can be implemented as hardware or software alone. In addition, while certain components have been described as being coupled or operatively connected to one another, such components may be integrated with one another or distributed in any suitable fashion.

Moreover, while illustrative embodiments have been described herein, the scope includes any and all embodiments having equivalent elements, modifications, omissions, combinations (e.g., of aspects across various embodiments), adaptations and/or alterations based on the present disclosure. The elements in the claims are to be interpreted broadly based on the language employed in the claims and not limited to examples described in the present specification or during the prosecution of the application, which examples are to be construed as nonexclusive. Further, the steps of the disclosed methods can be modified in any manner, including reordering steps and/or inserting or deleting steps.

Instructions or operational steps stored by a computer-readable medium may be in the form of computer programs, program modules, or codes. As described herein, computer programs, program modules, and code based on the written description of this specification, such as those used by the processors and postprocessor, are readily within the purview of a software developer. The computer programs, program modules, or code can be created using a variety of programming techniques. For example, they can be designed in or by means of Java, C, C++, assembly language, or any such programming languages. One or more of such programs, modules, or code can be integrated into a device system or existing communications software. The programs, modules, or code can also be implemented or replicated as firmware, FPGA code or circuit logic.

The features and advantages of the disclosure are apparent from the detailed specification, and thus, it is intended that the appended claims cover all systems and methods falling within the true spirit and scope of the disclosure. As used herein, the indefinite articles "a" and "an" mean "one or more." Similarly, the use of a plural term does not necessarily denote a plurality unless it is unambiguous in the given context. Words such as "and" or "or" mean "and/or" unless specifically directed otherwise. Further, since numerous modifications and variations will readily occur from studying the present disclosure, it is not desired to limit the disclosure to the exact construction and operation illustrated and described, and accordingly, all suitable modifications and equivalents may be resorted to, falling within the scope of the disclosure.

For the purposes of the detailed specification and appended claims, unless otherwise indicated, all numbers expressing quantities, percentages, or proportions, and other numerical values used in the specification and claims, are to be understood as being modified in all instances by the term "about," to the extent they are not already so modified. Accordingly, unless indicated to the contrary, the numerical parameters set forth in the following specification and attached claims are approximations that may vary depending upon the desired properties sought to be obtained.

In some aspects, methods consistent with disclosed embodiments may exclude disclosed method steps, or may vary the disclosed sequence of method steps or the disclosed degree of separation between method steps. For example, method steps may be omitted, repeated, or combined, as necessary, to achieve the same or similar objectives. In various aspects, non-transitory computer-readable media may store instructions for performing methods consistent with disclosed embodiments that exclude disclosed method steps, or vary the disclosed sequence of method steps or disclosed degree of separation between method steps. For example, non-transitory computer-readable media may store instructions for performing methods consistent with disclosed embodiments that omit, repeat, or combine, as necessary, method steps to achieve the same or similar objectives. In certain aspects, systems need not necessarily include every disclosed part, and may include other undisclosed parts. For example, systems may omit, repeat, or combine, as necessary, parts to achieve the same or similar objectives.

Other embodiments will be apparent from consideration of the specification and practice of the embodiments disclosed herein. It is intended that the specification and examples be considered as example only, with a true scope and spirit of the disclosed embodiments being indicated by the following claims.

What is claimed is:

1. An object identifying and tracking device, comprising:
a first image capturer configured to capture an invisible image of a trackable object, wherein the trackable object comprises at least two light elements of different wavelength combined together to form a light source, the at least two light elements comprises a first light element emitting invisible light and a second light element emitting visible light, the image of the invisible light is captured in the invisible image;
a second image capturer configured to capture a visible image of the trackable object, the image of the visible light is captured in the visible image, wherein the first image capturer and the second image capturer are disposed at two ends of an imaging device;
a first processor, coupled to the first image capturer, configured to receive the invisible image, determine a first candidate pixel region associated with pixels of the invisible light in the invisible image, and generate a candidate area corresponding to light sources of the visible image based on the first candidate pixel region;

a second processor, coupled to the second image capturer, configured to receive the visible image and generate a second candidate pixel region corresponding to light sources from the visible image based on the candidate area; and a post processor, coupled to the first processor and the second processor, configured to calculate 3D positions of light sources in real world based on the first candidate pixel region and the second candidate pixel region.

2. The object identifying and tracking device of claim 1, wherein:
the first image capturer comprises a first band-pass filter to allow the invisible light to pass through; and
the second image capturer comprises a second band-pass filter to allow the visible light to pass through.

3. The object identifying and tracking device of claim 2, wherein a bandwidth of the first band-pass filter and a bandwidth of the second band-pass filter do not overlap with each other.

4. The object identifying and tracking device of claim 3, wherein a wavelength of the invisible light is in a range from 760nm to 1 mm, and a wavelength of the visible light is in a range from 390 nm to 760 nm.

5. The object identifying and tracking device of claim 2, wherein the second band-pass filter comprises a color filter array.

6. The object identifying and tracking device of claim 5, wherein the color filter array is a Bayer RGB filter pattern.

7. The object identifying and tracking device of claim 1, wherein the first processor further configured to extract:
a pre-processed first image based on the invisible image;
a first coordinate of a center of the trackable object in the invisible image.

8. The object identifying and tracking device of claim 7, wherein the pre-processed first image is a binarization of the invisible image.

9. The object identifying and tracking device of claim 7, wherein the first coordinate of the center of the trackable object in the invisible image are determined by both said invisible image and the pre-processed image.

10. The object identifying and tracking device of claim 7, wherein the first coordinate coordinates of the center of the trackable object are calculated as a shape center of the first candidate pixel region associated with the trackable object in the invisible image.

11. The object identifying and tracking device of claim 7, wherein the first coordinate of the center of the trackable object are calculated as a weighted mean center of the pixels in the first candidate pixel region associated with the trackable object imaging in the invisible image.

12. The object identifying and tracking device of claim 7, wherein the candidate pixel area of the trackable object in the visible image is obtained by means of epipolar geometry and calculated using a fundamental matrix of the device.

13. The object identifying and tracking device of claim 12, wherein the fundamental matrix of the device is predetermined by calibrating the device before starting up the device, or by On the Fly Calibration after starting up the device.

14. The object identifying and tracking device of claim 5, wherein the second processor further configured to extract at least one of:
a pre-processed second image based on said visible image;

a second coordinate of a center of the pixels in the second candidate pixel region associated with the trackable object in the visible image; or
an identity of the trackable object.

15. The object identifying and tracking device of claim 14, wherein the pre-processed second image is a demosaic image generated from the visible image based on a pattern of the color filter array of the second band-pass filter.

16. The object identifying and tracking device of claim 14, wherein the second coordinate of the center of the trackable object are calculated as a shape center of the pixels in the second candidate pixel region associated with the trackable object in the visible image.

17. The object identifying and tracking device of claim 14, wherein the post processor further configured to extract at least one of:
a 3D coordinate of the center of the trackable object in space;
an identity of the trackable object;
an orientation of the trackable object in space;
a trajectory of the trackable object in space; or
a velocity and/or an acceleration of the trackable object in space.

18. An object identifying and tracking system, comprising:
at least one trackable object, comprising at least two light elements of different wavelength combined together to form a light source, wherein the at least two light elements comprises a first light element emitting invisible light and a second light element emitting visible light;
a first image capturer, disposed at one end of an imaging device, comprising a first band-pass filter allowing the invisible light to pass through and a first camera capturing light passing through the first band-pass filter;
a second image capturer, disposed at the other end of the imaging device, comprising a second band-pass filter allowing the visible light to pass through and a second camera capturing light passing through the second band-pass filter;
a first processor, coupled to the first image capturer, configured to instruct the first image capturer to capture an invisible image including the at least one trackable object and image of the invisible light, determine a first candidate pixel region associated with pixels of the invisible light in the invisible image, and generate a candidate area corresponding to light sources of the visible image based on the first candidate pixel region;
a second processor, coupled to the second image capturer, configured to instruct the second image capturer to capture a visible image including the at least one trackable object and image of the visible light, and generate a second candidate pixel region corresponding to light sources from the visible image based on the candidate area;
a post processor, coupled to the first processor and the second processor, configured to calculate 3D positions of light sources in real world based on the first candidate pixel region and the second candidate pixel region.

19. An object identifying and tracking method, comprising:
combining at least two light elements of different wavelength together to form a light source inside a trackable object, wherein the at least two light elements comprises a first light element emitting invisible light, and a second light element emitting visible light;

disposing the light source onto a place in real world whose location is interested by a virtual reality (VR) system;

constructing an image capture system using at least two image sensors disposed at two ends of an imaging device and two band-pass filters, wherein the first band-pass filter allows invisible light to pass through, and the second band-pass filter allows visible light to pass through;

capturing a pair of raw images, through the image capture system, by obtaining an invisible image through the first band-pass filter and a visible image through the second band-pass filter, wherein the image of the invisible light emitted by the first light element is captured in the invisible image, the image of the visible light emitted by the second light element is captured in the visible image;

processing the invisible image to determine a first candidate pixel region associated with pixels of the invisible light emitted by the first light element in the invisible image and generate a candidate area corresponding to light sources of the visible image based on the first candidate pixel region;

processing the visible image to generate a second candidate pixel region corresponding to light sources from the visible image based on the candidate area; and processing the first candidate pixel region and the second candidate pixel region to calculate 3D positions of light sources in real world.

* * * * *